US006177286B1

United States Patent
Chidambarrao et al.

(10) Patent No.: US 6,177,286 B1
(45) Date of Patent: Jan. 23, 2001

(54) REDUCING METAL VOIDS DURING BEOL METALLIZATION

(75) Inventors: Dureseti Chidambarrao, Weston, CT (US); Munir-ud-Din Naeem, Poughkeepsie, NY (US)

(73) Assignee: International Business Machines Corporation, Armonk, NY (US)

( * ) Notice: Under 35 U.S.C. 154(b), the term of this patent shall be extended for 0 days.

(21) Appl. No.: 09/159,952

(22) Filed: Sep. 24, 1998

(51) Int. Cl.[7] .................. H01L 21/66; H01L 21/4763; G01R 31/26
(52) U.S. Cl. ................ 438/14; 438/16; 438/622; 438/624
(58) Field of Search .................. 438/14, 7, 8, 9, 438/16, 622, 623, 624

(56) References Cited

U.S. PATENT DOCUMENTS

| | | | |
|---|---|---|---|
| 5,192,715 | * | 3/1993 | Sliwa, Jr. et al. .................... 438/631 |
| 5,652,465 | * | 7/1997 | Hosada et al. ........................ 257/758 |
| 5,716,872 | * | 2/1998 | Isobe ..................................... 438/624 |
| 5,759,906 | * | 6/1998 | Lou ....................................... 438/623 |
| 5,905,298 | * | 5/1999 | Watatani .............................. 257/635 |
| 5,955,380 | * | 9/1999 | Lee ....................................... 438/706 |

OTHER PUBLICATIONS

Wolf et al., Silicion Processing for the VLSI Era, vol. 1: Process Technology, pp. 567, 567, 1986, month unknown.*

* cited by examiner

Primary Examiner—John F. Niebling
Assistant Examiner—Walter L. Lindsay, Jr.
(74) Attorney, Agent, or Firm—Ratner & Prestia; Tiffany L. Townsend, Esq.

(57) ABSTRACT

A process for making metal lines in BEOL semiconductor devices. The process reduces metal voids in the metal lines. In one embodiment, metal lines, including a top barrier blanket are formed over an interlevel dielectric. An insulating layer having tensile stress is formed over the metal lines. A first compressive oxide layer is formed over the insulating layer, wherein the insulating layer provides a tensile stress on the metal lines and the compressive oxide layer provides a compressive stress on the metal lines resulting in reduction of metal voids. The compressive oxide layer is etched with a first type of gas until the insulating layer is reached. The insulating layer is etched with addition of gases to facilitate end-point detection. This second type of gas is monitored for an emission of species at an intensity level having a specific wavelength optical emission, and the etching is stopped when the intensity level is reached.

14 Claims, 3 Drawing Sheets

REDUCING METAL VOIDS DURING BEOL METALLIZATION

TECHNICAL FIELD

The present invention relates, in general, to the process of making back end of the line (BEOL) semiconductor device interconnections and, more specifically, to a process for reducing the metal voids in metal lines for BEOL semiconductor devices.

BACKGROUND OF THE INVENTION

Methods for fabricating metal lines for back end of the line (BEOL) applications in semiconductor devices are well known in the art. For example, FIG. 1 illustrates a typical fabrication of two metal lines in BEOL semiconductor device 10 and involves patterning of a metal layer using is lithography and metal reactive ion etch (RIE) techniques. A bottom barrier blanket layer, such as a Ti or TiN layer, is deposited on top of interlevel dielectric 11. This bottom barrier blanket layer is followed by deposition of a high conductivity metal, usually Al with 0.5% Cu. The high-conductivity layer is then covered by depositing a top barrier blanket layer, such as a Ti or TiN layer.

A photoresist layer is patterned into a mask (not shown) over portions of the layers in a known fashion. After photoresist exposure, the masking material (photoresist in this case) is removed in areas where the metal is to be removed by the RIE process. One such structure produced after the RIE process is shown in FIG. 1. As shown, the structure contains (1) metal line 12a sandwiched between top barrier 13a and bottom barrier 14a, and (2) metal line 12b sandwiched between top barrier 13b and bottom barrier 14b.

Following patterning of the final metal layer, a passivation layer (not shown) is deposited over the entire top surface of the wafer. This is an electrically insulating and protective layer that prevents mechanical and chemical damage during assembly and packaging of the wafer. Thus, metal lines 12a and 12b are usually encapsulated by a dielectric deposition of oxides. These oxides may be deposited by chemical vapor deposition (CVD), plasma enhanced CVD (PECVD), or high density plasma (HDP) deposition.

It has been observed that voids may occur in the is metal lines due to some process imperfection. The voids may appear on one side of the metal line or on both sides of the metal line. It has been believed that these voids occur because of "undercut" conditions during the RIE process. Because the voids are imperfections in the metal lines, they contribute to decreasing the reliability of the semiconductor.

It is also known that dielectrics such as HDP, CVD, and PECVD oxides, used commonly in the semiconductor industry for BEOL passivation, exert compressive stress (expressed as a negative force pushing down) on the metal lines. The compressive stress may also be a factor in producing voids in the metal lines. The stress-induced voids also contribute to the reduced reliability of the semiconductor device.

The deficiencies of the conventional processes used to make metal lines in BEOL semiconductor devices show that a need still exists for a process which can reduce or eliminate the metal voids created in these metal lines after the metal layer has been deposited on the substrate.

SUMMARY OF THE INVENTION

To meet this and other needs, and in view of its purposes, the present invention provides a process for making metal lines in BEOL semiconductor devices. The process reduces metal voids in the metal lines and, in one embodiment, includes the following steps:

(a) metal lines, including a top barrier blanket, are formed over an interlevel dielectric, (b) an insulating layer having tensile stress properties is formed over the metal lines, (c) a first compressive oxide layer is formed over the insulating layer, wherein the insulating layer provides a tensile stress on the metal lines and the compressive oxide layer provides a compressive stress on the metal lines resulting in reduction of metal voids, (d) the compressive oxide layer is etched with one type of gas until the insulating layer is reached, (e) the insulating layer is etched with a second gas until the top barrier blanket is reached, (f) the second gas is monitored for an intensity level at a wavelength optical emission, and (g) the etching is stopped when the intensity level is reached.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures.

DETAILED DESCRIPTION OF THE INVENTION

As mentioned before, FIG. 1 illustrates a typical fabrication of two metal lines 12a and 12b in BEOL semiconductor device 10 involving patterning and metal reactive ion etching (RIE). A bottom barrier blanket (shown as bottom barriers 14a and 14b after etching) is formed (e.g., deposited) on interlevel dielectric 11. The bottom barrier blanket may consist of a Ti or TiN layer; it may consist of both layers of Ti and TiN. Furthermore, it may also consist of a metal from groups IVB, VB, VIB and VIII in the Periodic Table, its compound with Si or N, and other refractory metals. Following the formation of the bottom barrier blanket, a high-conductivity metal layer (shown as metal lines 12a and 12b after etching) is deposited on top of the bottom barrier blanket. The high-conductivity metal may consist of A1 with 0.5% Cu. The high-conductivity metal layer is then covered by a top barrier blanket (shown as top barriers 13a and 13b after etching). Like the bottom barrier blanket, the top barrier blanket may be formed by depositing a similar metal on top of the high-conductivity metal.

By methods well known in the art, a photoresist (not shown) is formed on the top barrier blanket. The photoresist is then patterned into a mask using, for example, a conventional photolithographic technique. The top barrier blanket is then selectively removed with, for example, a wet etch or metal RIE. In an exemplary embodiment, this etch is followed in sequence by reactive ion etching of the high-conductivity metal layer, using the same patterned photoresist mask. Etching then continues until the bottom barrier blanket is selectively removed.

Figure 1:
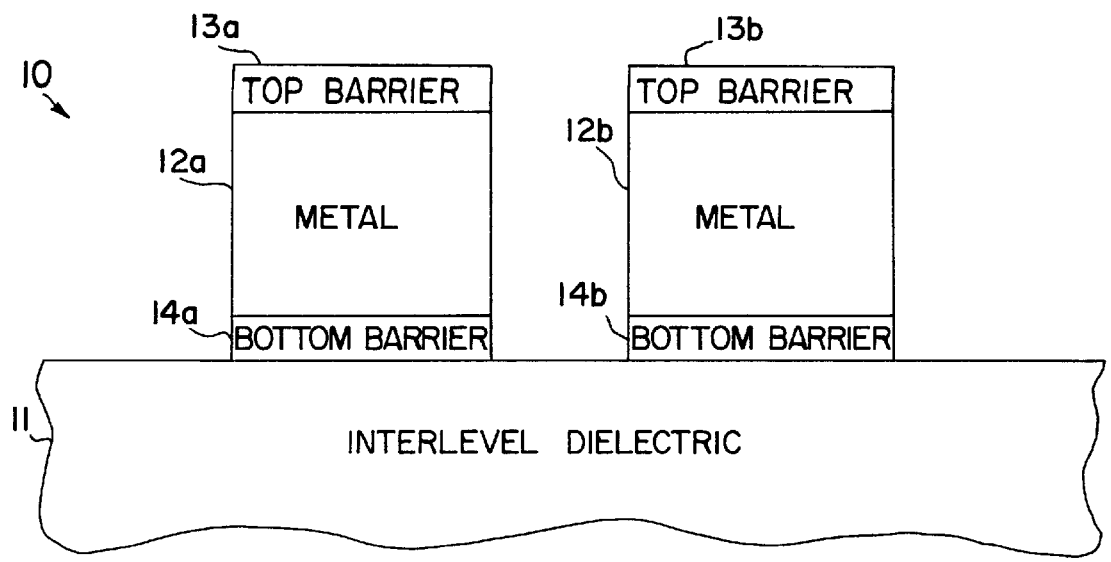
FIG. 1 is a cross-section of a BEOL semiconductor device showing metal lines after metal etching, post metal etch cleaning, and thermal treatments.

FIG. 1 illustrates a result of the foregoing steps, whereby portions of the bottom barrier blanket, namely bottom barrier 14a and bottom barrier 14b, remain above interlevel dielectric 11. Also remaining is metal line 12a, metal line 12b, top barrier 13a, and top barrier 13b.

Voids may appear on one side of the metal lines 12a and 12b or on both sides of the metal lines 12a and 12b. It was previously believed that "undercut" conditions during the metal RIE process caused these voids. Partition experiments by the inventors showed, however, that no voids are observed in metal lines 12a and 12b after routine processes of metal RIE, post-RIE cleaning, and temperature annealing of the structure shown in FIG. 1. In fact, no voids were observed until after routine passivation of the structure. After deposition of chemical vapor deposited (CVD) oxides, plasma-enhanced CVD (PECVD) oxides, or high-density plasma (HDP) oxides, the voids in the metal lines were observed.

The partition experiments by the inventors clearly indicated that the voids, which may be systemic in nature, are not due to RIE undercut. In order to ascertain the reason for the voids formed at certain specific sites of metal lines 12a and 12b, simulations were done for stress conditions in these structures. Von Mises stress simulations were performed using a commercially available program called ABAQUS. The data indicated that, if the metal line side wall profile were tapered, more stress was concentrated at the bottom of the structure on the tapered side wall as compared with a vertical side wall profile. Therefore, a conclusion was formed that the voids may be due to the compressive stress exerted by commonly used oxides for BEOL passivation.

It is known that dielectrics such as HDP, CVD, and PECVD oxides, used commonly in the semiconductor industry for BEOL passivation, exert compressive stress (expressed as negative stress) on metal lines. Whereas another form of oxides, known as flowable oxides, have tensile stress (expressed as positive stress) properties. Examples of flowable oxide materials are the spin-on glass (SOG) materials. SOG materials may be siloxanes or silicates mixed in alcohol-based solvents. Some commercially available flowable oxides are FOx (trademark of Dow Corning) and ACCUSPIN 418 (trademark of Allied Signal, Inc.). It will also be appreciated that other insulating films having tensile stress properties, such as polyimide, may be used. As will be explained, by devising a process of alternating layers of flowable oxides (or other insulating films with tensile stress properties) and one or more of the traditional PECVD, CVD, and HDP oxides, the inventors discovered that a favorable compromise between positive and negative stress conditions can be achieved. Such conditions yield minimum stress on metal lines and eliminate or reduce stress-induced voids in these lines during dielectric deposition. With reduced voiding, the reliability of the device may be improved.

A process using such alternating layers of flowable oxides and traditional oxides was developed by the inventors and showed no voids in the metal lines after dielectric deposition. The process is illustrated in FIG. 1 through FIG. 5. Having already described FIG. 1, FIGS. 2–5 will now be described.

Figure 2:
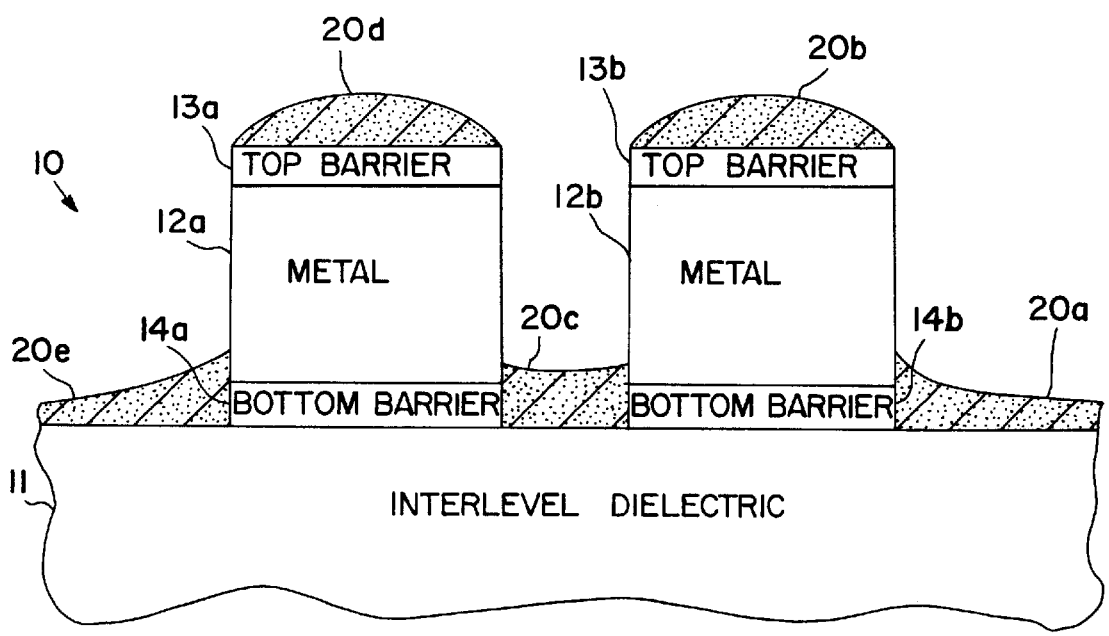
FIG. 2 is a cross-section of the BEOL semiconductor device of FIG. 1 showing a flowable oxide dielectric layer having been deposited on top of the structure.

As illustrated in FIG. 2, a thin flowable oxide layer may be deposited on top of the layers shown in FIG. 1. The flowable oxide layer is shown as flowable oxide 20a, 20b, 20c, 20d, and 20e in FIG. 2. The flowable oxide may be, for example, FOx (trademark of Dow Corning) or ACCUSPIN 418 (trademark of AlliedSignal, Inc.) and is 5–1000 nm thick, and preferably 200–400 nm thick. After deposition of the flowable oxide, BEOL semiconductor device 10 is baked at a temperature between 50° C.–700° C., and preferably between 300° C. to 500° C. The flowable oxide provides a tensile stress on top of BEOL semiconductor device 10.

Figure 3:
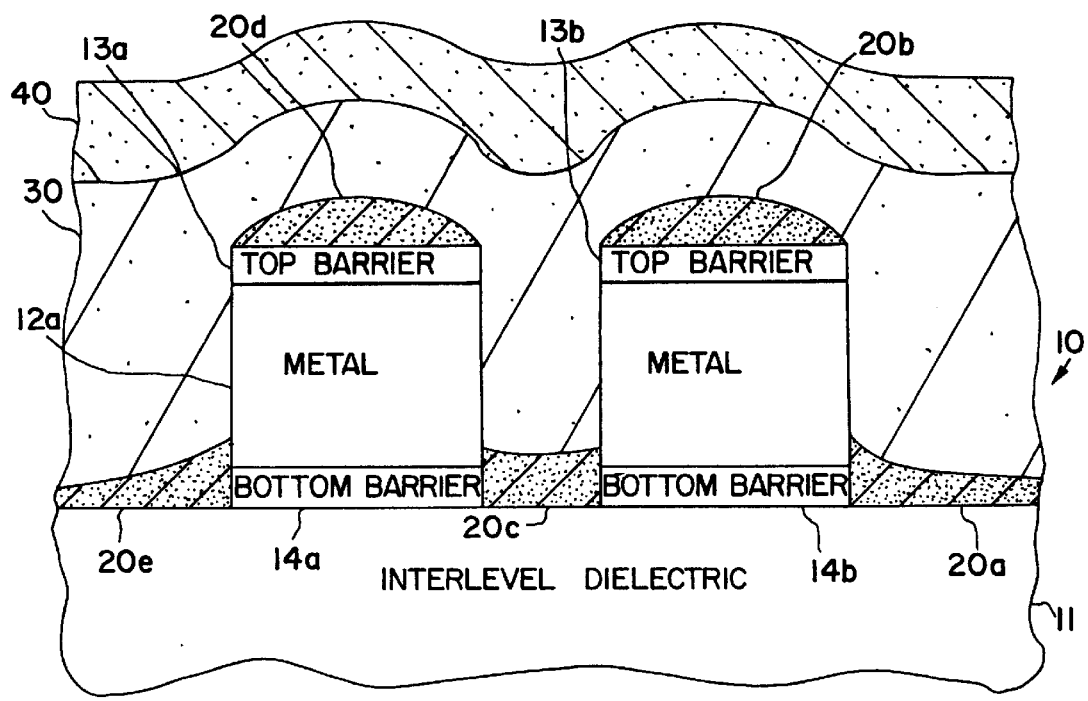
FIG. 3 is a cross-section of the BEOL semiconductor device of FIG. 2 showing two dielectric layers having been deposited on top of the flowable oxide layer.

BEOL semiconductor device 10 is next subjected to two or more depositions of conventional oxide layers, first compressive layer 30 and second compressive layer 40, as shown in FIG. 3. First compressive layer 30 may be formed from a deposition of HDP oxide or another oxide. Second compressive layer 40 may be formed from a deposition of CVD oxide, PECVD oxide, or another oxide. It will be appreciated that additional layers may be formed on BEOL semiconductor device 10, but preferably the layers may be alternating layers of an insulating film having tensile stress properties followed by an insulating film having compressive stress properties, followed by a tensile layer, and so on.

Figure 4:
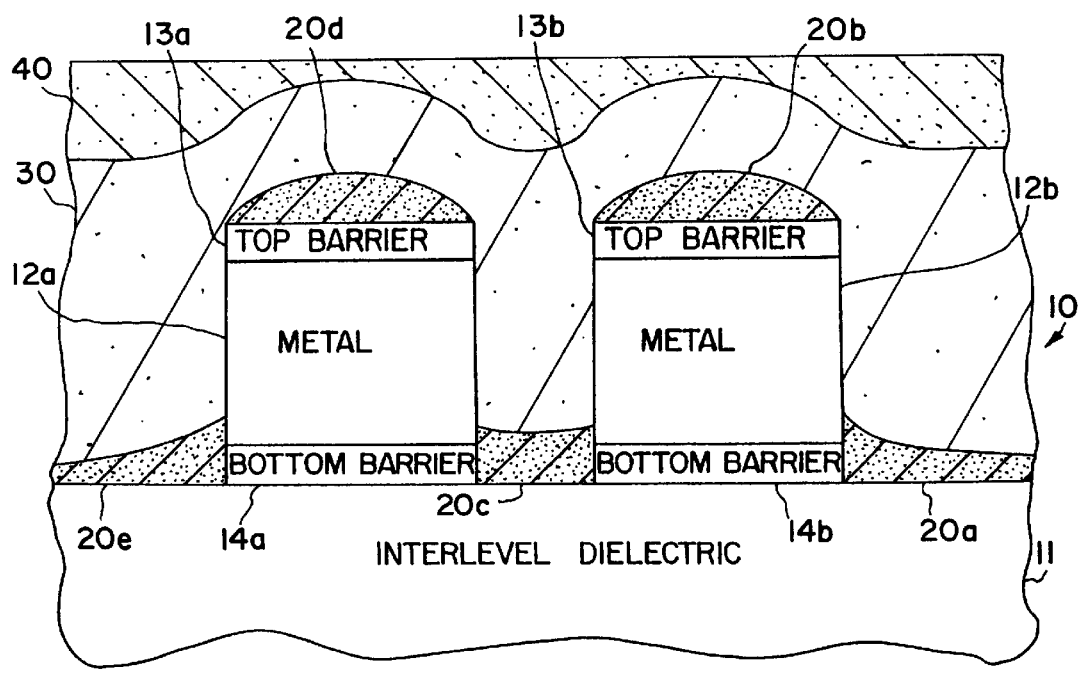
FIG. 4 is a cross-section of the BEOL semiconductor device of FIG. 3 showing the structure after planarization.

The next step in the process is illustrated in FIG. 4 where second compressive layer 40 is planarized by s conventional chemical and mechanical polishing or other techniques. Next, a photoresist layer is patterned into a mask over second compressive layer 40. After photoresist exposure, the masking material (photoresist in this case) is removed in areas where the via holes will be etched to make contact with metal lines 12a and 12b. The remaining photoresist is shown in FIG. 5 as photoresist 50a, 50b, and 50c.

Figure 5:
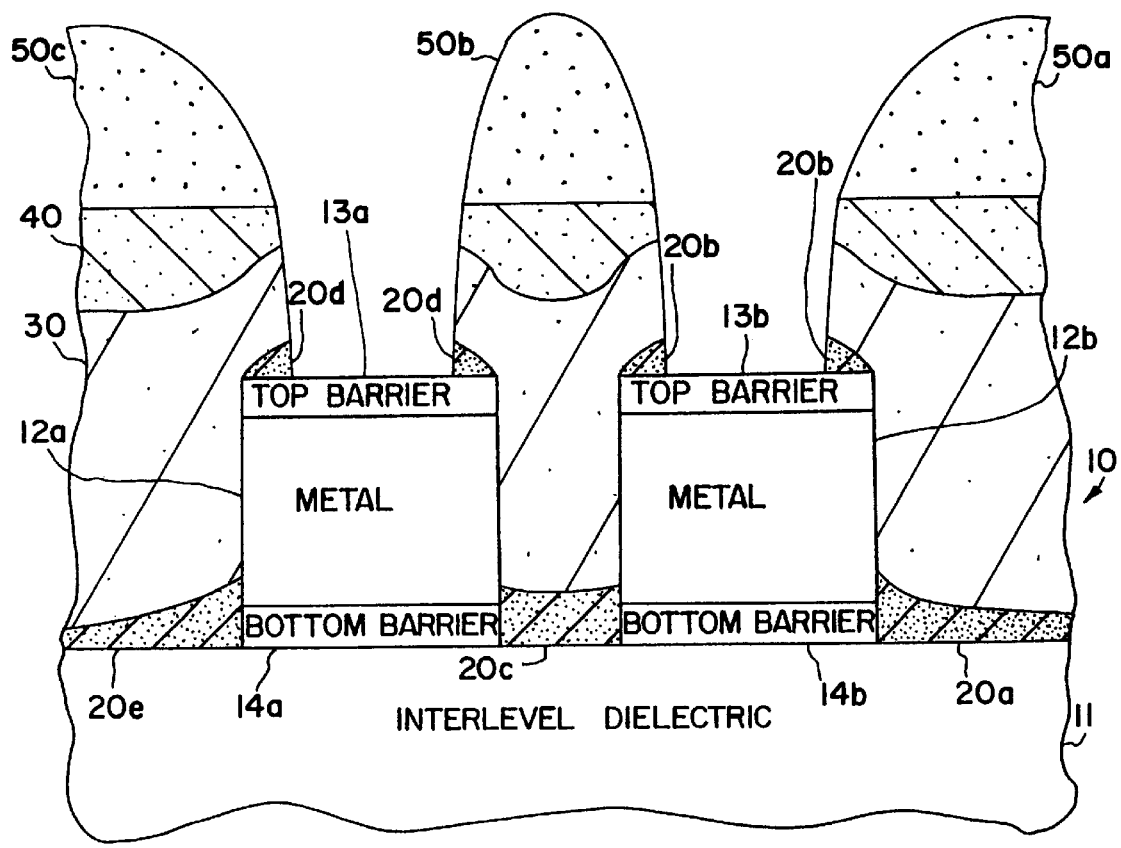
FIG. 5 is a cross-section of the BEOL semiconductor device of FIG. 4 after photoresist patterning and dielectric etching to open contact holes to the metal lines.

During the etching process to form the via holes, the two layers of compressive oxide layers 30 and 40, as well as the layers of flowable oxide 20a, 20b, 20c, 20d, and 20e must be completely removed so that top barriers 13a and 13b are exposed for subsequent metallization after oxide etching, as shown in FIG. 5. The inventors met this requirement by modifying the oxide etching process. The special oxide etching process includes detecting the endpoint time for etching the oxides. The end-point time may be used to signal the appearance of top barriers 13a and 13b. The end-point detection process has the following sequential steps:

(a) First, the compressive oxides are etched using traditional gas chemistries such as $CHF_3/CF_4$ or other fluorocarbon gases with diluents (inert gases). As an example, first compressive layer 30 and second compressive layer 40, which have been formed from one or more HDP, PECVD, and HDP oxides, may be removed using traditional gas chemistries.

(b) The gas chemistry is then changed by switching to a second gas chemistry containing, for example, the addition of Cl-containing species (such as $Cl_2$, HCl, and $BCl_3$) to the traditional gas chemistry enumerated in (a).

(c) Etching is then continued into the flowable oxides using the gas chemistry of (b). The emission of species during this portion of the etching process is monitored using about 704 nm wavelength optical emission spectroscopy. As the etching approaches top barriers 13a and 13b, titanium species, for example, from top barriers 13a and 13b, begin to react with the gas chemistry containing for example Cl. The reaction forms a species containing Ti and Cl, such as $TiCl_x$, for example. The presence of this species, as well as its intensity level, may be observed with 704 nm wavelength optical emission spectroscopy. It will be understood that the addition of Cl containing gases for end point monitoring is not limited to Cl species and can also have other gaseous compounds of halogen gases in group VIIA with an appropriate monitoring of by-product species of these gases with metals used in the interconnect structure.

Figure 6:
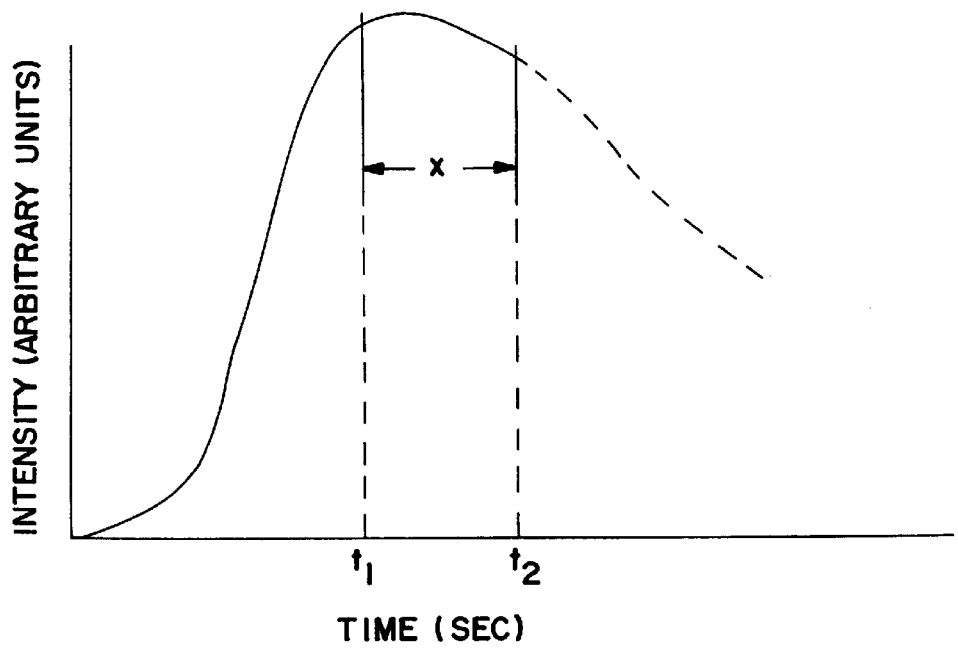
FIG. 6 is a plot of intensity of the presence of certain chemical species during the time of oxide etching, and tailoring an appropriate over-etch time to ensure complete opening of the contact holes of FIG. 5.

(d) Finally, an appropriate over-etch time is tailored to ensure complete removal of the layers of flowable oxide 20b and 20d. In this manner, complete via openings may be achieved to ensure good contact for subsequent metallization with top barriers 13a and 13b. The tailoring of the over-etch time is shown in FIG. 6. As shown, the optical emission intensity level of $TiCl_x$ type species, for example, increases as top barriers 13a and 13b are cleared of any oxides. At time $t_1$, the peak intensity level is reached. An appropriate time, $t_2-t_1$, usually between 2–200 seconds, and preferably between 3–20 seconds, may be allowed for over-etching to account for any RIE lags in the etching process.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention. It will be understood, for example, that the present invention is not limited to only the compressive oxides and the flowable oxides described herein. Rather, the invention may be extended to other insulating films, so long as one film has compressive stress properties and the other film has tensile stress properties. Furthermore, the present invention is not intended to be limited to the deposition sequence described herein. Rather, the invention may be extended to other deposition sequences, such as the deposition of one layer of flowable oxide and then one layer of a compressive oxide, or multiple layers of tensile stress films alternating with compressive stress films.

Moreover, the etch monitoring process described herein is not intended to be limited to monitoring $TiCl_x$ type species with 704 nm wave length spectroscopy. Rather, the invention may be extended to other wave length spectroscopy depending on the type of material contained in the film to be removed from the top of the metallic layers. Furthermore, the invention may be extended to other detection methods, optical or otherwise, that will detect metallic species as etch by product to control the etch process.

What is claimed:

1. A process for reducing voids in corners of metal lines in a back end of the line (BEOL) semiconductor device, the process comprising the steps of:
   (a) forming metal lines directly on top of an interlevel dielectric,
   (b) forming an insulating layer having tensile stress properties directly on top of the metal lines, and
   (c) forming a first compressive oxide layer over the insulating layer, wherein the insulating layer provides a tensile stress on the metal lines and the first compressive oxide layer provides a compressive stress on the metal lines resulting in the reduction of voids in the corners of the metal lines in the BEOL semiconductor device.

2. The process of claim 1 wherein the insulating layer is spin-on glass material.

3. The process of claim 2 wherein the insulating layer is 5–1000 nm thick.

4. The process of claim 3 wherein step (b) includes baking the insulating layer at a temperature between 50° C. and 700° C.

5. The process of claim 4 wherein step (c) includes forming a second compressive oxide layer over the first compressive oxide layer.

6. The process of claim 5 wherein step (a) includes forming a top barrier layer over the metal lines, the top barrier layer selected from a group consisting of a metal from groups IVB, VB, VIB, and VIII in the Periodic Table, its compound with Si or N, and other refractory metals.

7. The process of claim 6 wherein the following steps are added after step (c):
   (d) etching the first and second compressive oxide layers with a first gas until the insulating layer is reached,
   (e) etching the insulating layer with a second gas until the top barrier layer is reached,
   (f) monitoring the second gas for an intensity level, and
   (g) stopping the etching when the intensity level is reached.

8. The process of claim 7 wherein step (g) includes stopping the etching between 2–200 seconds after a peak intensity level is reached.

9. The process of claim 8 wherein the second gas includes a gaseous compound formed with one halogen gas of group VIIA in the Periodic Table.

10. The process of claim 9 wherein the second gas includes one of $Cl_2$, HCl and $BCl_3$, and is monitored for an intensity level at about 704 nm wavelength.

11. A process for reducing voids in corners of metal lines in a BEOL semiconductor device, the process comprising the steps of:
   (a) forming metal lines directly on top of an interlevel dielectric, the metal lines including a top barrier layer, the top barrier layer selected from a group consisting of a metal from groups IVB, VB, VIB and VIII in the Periodic Table, its compound with Si or N, and other refractory metals,
   b) forming an insulating layer having tensile stress properties directly on top of the metal lines while baking at a temperature between 50° C. and 700° C., wherein the insulating layer has a thickness of 5–1000 nm,
   (c) forming a first compressive oxide layer over the insulating layer, wherein the insulating layer provides a tensile stress on the metal lines and the first compressive oxide layer provides a compressive stress on the metal lines,
   (d) forming a second compressive oxide layer over the first compressive oxide layer,
   (e) etching the first and second compressive oxide layers with a first gas until the insulating layer is reached,
   (f) etching the insulating layer with a second gas consisting of one of $Cl_2$, HCl, and $BCl_3$ until the top barrier layer is reached,
   (g) monitoring the second gas for the presence of $TiCl_x$ type species at an intensity level at about 704 nm wavelength optical emission, and
   (h) stopping the etching between 2–200 seconds after the intensity level is reached.

12. The process of claim 11 wherein the insulating layer is spin-on glass material.

13. The process of claim 11 wherein step (d) includes forming a second insulating layer having tensile stress properties over the first compressive oxide layer before forming the second compressive oxide layer and step (e) includes etching the second insulating layer.

14. The process of claim 10 wherein the monitoring includes detecting a presence of $TiCl_x$ type species.

* * * * *